(12) United States Patent
Yeager

(10) Patent No.: US 6,770,691 B2
(45) Date of Patent: Aug. 3, 2004

(54) CURABLE EPOXY RESIN COMPOSITIONS AND THE CURED RESIDUES THEREOF

(75) Inventor: Gary W. Yeager, Schenectady, NY (US)

(73) Assignee: General Electric Company, Pittsfield, MA (US)

( * ) Notice: Subject to any disclaimer, the term of this patent is extended or adjusted under 35 U.S.C. 154(b) by 179 days.

(21) Appl. No.: 09/683,887

(22) Filed: Feb. 27, 2002

(65) Prior Publication Data

US 2002/0107308 A1 Aug. 8, 2002

Related U.S. Application Data

(62) Division of application No. 09/393,772, filed on Sep. 10, 1999, now Pat. No. 6,387,990.

(51) Int. Cl.[7] .............................. C08K 5/06; C08L 63/02
(52) U.S. Cl. ...................... 523/456; 523/461; 525/109; 525/120; 525/391; 525/396; 525/523
(58) Field of Search ................................ 523/456, 461; 525/109, 120, 391, 396, 523

(56) References Cited

U.S. PATENT DOCUMENTS

| | | |
|---|---|---|
| 2,444,536 A | 7/1948 | Searle |
| 3,590,042 A | 6/1971 | Cyba |
| 3,595,900 A | 7/1971 | Loudas et al. |
| 3,733,349 A | 5/1973 | Loudas et al. |
| 3,962,184 A | 6/1976 | Notomi et al. |
| 4,022,755 A | 5/1977 | Tanigaichi et al. |
| 4,026,913 A | 5/1977 | Tanigaichi et al. |
| 4,039,538 A * | 8/1977 | Klinkenberg et al. ....... 544/219 |
| 4,116,946 A | 9/1978 | Jakob et al. |
| 4,195,132 A | 3/1980 | Sundermann et al. |
| 4,389,516 A | 6/1983 | Sugio et al. |
| 4,528,366 A | 7/1985 | Woo et al. |
| 4,604,452 A | 8/1986 | Shimp |
| 4,709,008 A | 11/1987 | Shimp |
| 4,740,584 A | 4/1988 | Shimp |
| 4,785,075 A | 11/1988 | Shimp |
| 4,849,486 A | 7/1989 | Tsuchiya et al. |
| 4,902,752 A | 2/1990 | Shimp |
| 4,923,912 A | 5/1990 | Sasaki et al. |
| 4,975,319 A | 12/1990 | Walles et al. |
| 4,983,683 A | 1/1991 | Shimp |
| 5,043,367 A | 8/1991 | Hallgren et al. |
| 5,068,309 A | 11/1991 | Shimp et al. |
| 5,141,791 A | 8/1992 | Chao et al. |
| 5,149,863 A | 9/1992 | Shimp et al. |
| 5,213,886 A | 5/1993 | Chao et al. |
| 5,218,030 A | 6/1993 | Katayose et al. |
| 5,352,745 A | 10/1994 | Katayose et al. |
| 5,834,565 A | 11/1998 | Tracy et al. |

OTHER PUBLICATIONS

Chemical Abstracts Record for JP02055722.
Chemical Abstracts Record for JP08003398.
Chemical Abstracts Record for JP01003223.
Chemical Abstracts Record for JP02055721.
Chemical Abstracts Registry File Record for Pyroguard SR 245.

* cited by examiner

Primary Examiner—Philip Tucker
Assistant Examiner—D. Aylward

(57) ABSTRACT

A cured composition is the cured residue of a curable composition including (a) an epoxy resin essentially free of bromine atoms, a curing agent for the epoxy resin, (b) a flame retardant additive that is the condensation product of (i) a brominated phenol or a mixture of brominated phenols with (ii) a cyanuric halide; and (c) a thermoplastic resin. The preferred epoxy resin is a mixture of an epoxy resin with less than 2 glycidyl ether groups per molecule and an epoxy resin that has greater than 2 glycidyl ether groups per molecule. The preferred flame-retardant additive is a brominated heterocyclic compound that preferably is a triazine. The preferred thermoplastic resin is a poly(phenylene ether). The cured composition further including a reinforcement may be used in the manufacture of circuit boards having excellent electrical properties, good solvent resistance, and good thermal expansion characteristics. Laminates including the cured compositions and a metal foil are also described.

38 Claims, No Drawings

CURABLE EPOXY RESIN COMPOSITIONS AND THE CURED RESIDUES THEREOF

CROSS REFERENCE TO RELATED APPLICATIONS

This application is a division of U.S. application Ser. No. 09/393,772, filed Sep. 10, 1999, now U.S. Pat. No. 6,387,990.

BACKGROUND OF INVENTION

The present invention relates to curable flame retardant compositions and more particularly to curable epoxy compositions containing a brominated triazine flame retardant additive which compositions are ideally suited for fabricating circuit boards.

Metal-clad boards, particularly such boards for use in fabricating printed circuits, are well-known in the art. The simplest of such boards generally comprises a resinous plastic (polymeric) substrate to which is bonded at least one thin sheet of an electrically conductive material, preferably copper. The resinous plastic substrate can be clad with the metal foil on one or both sides, depending upon the desired use, and can be rigid or flexible depending upon the composition of the resinous plastic substrate, the choice of reinforcement (if any), and the intended use of the board.

A number of polyphenylene ether compositions having favorable dielectric properties and utility in circuit board manufacture are known. However, there is a growing need in the industry for laminates with good thermal performance, solvent resistance, and improved dielectric properties such as dissipation factor and dielectric constant. Due to deficiencies in one or more properties, many such compositions have not attained wide commercial use. Specifically, while polyphenylene ethers are excellent dielectrics, deficiencies often are found in areas such as solvent resistance, flammability, and resistance to high temperatures. Polyphenylene ethers often are combined with polyepoxides in an attempt to improve upon the aforementioned properties, but such combinations have not been found to be wholly satisfactory either.

In addition to excellent dielectric properties, resinous compositions useful in printed circuit board manufacture also should be highly flame-retardant. A V-1 rating, as determined by Underwriters Laboratories test procedure UL-94, is universally required, with V-0 usually being necessary. The V-0 rating requires a flame-out time (FOT) of not more than 10 seconds in any trial and a cumulative FOT of not more than 50 seconds for five samples. As a practical matter, purchasers often mandate a maximum cumulative FOT of 35 seconds.

The fabricated board should not lose substantial weight and its surface should not be appreciably marred by contact with methylene chloride, a solvent commonly used for cleaning. Since connections with the printed circuit typically are made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In preparing rigid metal-clad boards, it is common to form individual lamina, commonly called prepregs, by formulating a resinous binder composition made from epoxy, modified styrene, or the like. A solvent solution of the resin is placed in an apparatus known as a "dip tank." Continuous webs of reinforcement can be pre-impregnated in the tank and then dried in a vertical or horizontal treating tower or oven. Normally, the resin is partially cured or B-staged after exiting the treater tower or oven. The copper foil, optionally coated with an adhesive, is placed on one side of the prepreg and subjected to heating under pressure to effect a bond between the metal foil and the substrate. Multiple prepregs can be used in forming a single composite board. Additionally, multilayer printed wiring boards will have a number of interposed laminae and copper sheets.

Pressing of the boards can be effected in a press by placing the foil/substrate structure between the platens and closing the press, or a continuous belt can be used. The curing cycle in the press will depend upon the nature and thickness of the laminate, the time and temperature of the cycle being those required to cure the substrate, and the bonding adhesive layer, if present. Sufficient pressure is required to effect adequate flow of the adhesive and/or substrate resins in order to wet-out and bond adequately. The pressure must be sufficient to prevent blistering which is due to the release of gases resulting either from retained volatiles in the substrate or adhesive layers, or resulting from by-products of the curing process.

Japanese patent 64[1988]-3223 describes blends of bisphenol-A diglycidyl ether, TBBPA diglycidyl ether, epoxy phenol novolac and curing agents such as amines. However, the resulting material produces laminates with inferior solvent resistance and is, thus, not suitable from printed circuit board laminates.

Japanese patents Hei 2[1990]-55721 and Hei 2[1990]-55722 describe laminates with improved chemical resistance, comprising (1) a bisphenol poly(glycidyl ether), epoxy novolac, and brominated bisphenol reaction product; (2) a poly(phenylene ether); (3) a novolac resin; (4) a lead salt; and (5) $Sb_2O_3$. However, the resulting trichloroethylene resistance still is not adequate in the cured product, and surface roughening is observed.

Walles et al. (U.S. Pat. No. 4,975,319) describe compositions comprising (1) a bisphenol poly(glycidyl ether), epoxy novolac, and brominated bisphenol reaction product; (2) a poly(phenylene ether); (3) a novolac resin, curing agents, and hardeners that produce laminates with dissipation factors in the range of 0.011–0.016.

Haligren etal. (U.S. Pat. No. 5,043,367) describes (1) poly(phenylene ether); (2) halogenated bisphenol diglycidyl ether non-halogenated diglycidyl ether, and various curing agents which produce solvent resistant laminates having dissipation factors in the range of 0.011–0.013.

Katayose etal. (U.S. Pat. No. 5,218,030) describes the use of (i) a poly (phenylene ether) containing pendant allyl or propargyl groups; (ii) triallylcyanurate or triallylisocyanurate; and optionally (iii) a flame retardant; or (iv) an antimony-containing auxiliary flame retardant.

Katayose etal. (U.S. Pat. No. 5,352,745) disclose compositions with improved solvent resistance comprising a high molecular weight functionalized poly(phenylene ether) resin ($\eta$=0.30–0.56 IV PPO) produced through reactive extrusion of poly (phenylene ether) with maleic anhydride. Formulation of (i) the reaction product of poly(phenylene ether) (PPE) with an unsaturated acid or acid anhydride with, (ii) triallylcyanurate or triallylisocyanurate, (iii) a brominated epoxy resin, (iv) novolac resins, and (v) a cure catalyst, produces flame retardant and solvent resistant resins useful in the production of printed circuit boards. This patent shows that a portion of the amino functionalized end groups contain capping residues. The skilled artisan would recognize that such end groups would comprise less than 10% of the hydroxyl end groups and would not be sufficient to significantly accelerate the cure rate of an allylic thermoset.

Chao et al. (U.S. Pat. No. 5,213,886) describe blends of low molecular weight poly(phenylene ether) compounds and epoxy resins. Tracy etal. (U.S. Pat. No. 5,834,565) describe blends of low molecular weight poly(phenylene ether) compounds in thermosetting matrices such as epoxy resins and unsaturated polyesters. These thermosetting compositions exhibit improved processability over analogous compositions containing high molecular weight poly (phenylene ether) compounds.

None of the foregoing art discloses the present flame-retardant blends that display excellent electrical properties, good solvent resistance, and good thermal expansion characteristics.

SUMMARY OF INVENTION

A curable composition comprises (a) an epoxy resin and curing agent therefor, wherein said epoxy resin is essentially free of bromine atoms; (b) a flame retardant additive essentially free of phenolic groups and of epoxy groups, wherein said flame retardant is a condensation product of (i) a brominated phenol or a mixture of brominated phenols with (ii) a cyanuric halide; (c) a thermoplastic resin; and (d) a cyanate ester. The preferred epoxy resin component comprises an epoxy resin or mixture of epoxy resins with have on average greater than 2 glycidyl ether groups per molecule. The preferred flame-retardant additive is a brominated triazine compound. The preferred thermoplastic resin is a resin having a Tg greater than 130° C. and most preferably a poly(phenylene ether).

The inventive curable compositions advantageously can be combined with reinforcement in the manufacture of circuit boards having excellent electrical properties, good solvent resistance, and thermal properties.

DETAILED DESCRIPTION

The present invention includes flame retardant and solvent resistant laminates with excellent thermal and dielectric properties ideally suited for electrical laminates. Such compositions comprise (a) an epoxy resin and curing agent therefor, wherein said epoxy resin is essentially free of bromine atoms; (b) a flame retardant additive essentially free of phenolic groups and of epoxy groups, wherein said flame retardant is a condensation product of (i) a brominated phenol or a mixture of brominated phenols with (ii) a cyanuric halide; (c) a thermoplastic resin; and (d) a cyanate ester.

The epoxy resin component comprehends molecules containing one or more oxirane ring groups. Useful epoxy resins include, for example, glycidyl ethers, partial reaction products of glycidyl ethers with phenols (either monomeric or polymeric), or cycloaliphatic epoxies. Epoxy resins useful in the present invention include those described in *Chemistry and Technology of the Epoxy Resins*; Ellis, B. Ed.; Blackie Academic & Professional imprint of Chapman & Hall: London (1993). Preferred epoxies include, for example, multifunctional glycidyl ethers exemplified by epoxidized phenol-formaldehyde novolacs, epoxidized cresol-formaldehyde novolacs and other epoxidized alkylphenol-formaldehyde novolacs, epoxidized 1,1,1-tris(4-hydroxyphenyl)ethane, epoxidized 1,1,2,2-tetra(4-hydroxyphenyl) ethane, epoxidized phenol-dicyclopentadiene novolacs, and epoxidized phenol-benzaldehyde novolacs. Preferably, the epoxy resin component is essentially free of bromine atoms. This means that the epoxy resin component has less than a 1% bromine atom content.

Useful catalysts/curing agents for the epoxy resin component include those described by B. Ellis in *Chemistry and Technology of The Epoxy Resins*, Chapman and Hall, New York, N.Y. (1993) and also in U.S. Pat. Nos. 5,141,791, 4,923,912, and 4,849,486, the disclosures of which are expressly incorporated herein by reference. Catalysts effective as curing agents for epoxy resins, such as, for example, imidazoles, may be utilized in the practice of the invention. Particularly useful imidazoles include, for example, imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl)-2-phenylimidazole. Preferred imidazoles include, for example, 1,2-dimethylimidazole and 2-heptadecylimidazole. Particularly preferred in the practice of the present invention, however, is a catalyst package formed from a dicyanadiamide, benzyldimethylamine, and 2-methylimidazole. For present purposes, catalysts for cure of the epoxy resin are included within the term "curing agent". That is, a catalyst can be a curing agent.

Brominated heterocyclic compounds useful in the present invention include any compound containing both bromine groups and a heterocyclic moiety, such as, for example, triazine, pyrrole, or oxidized derivatives thereof. Preferred brominated heterocyclic compounds are brominated triazines. Such compounds often are prepared by the condensation of a brominated phenol or mixture of brominated phenols with a cyanuric halide, such as cyanuric chloride, most often in the presence of a basic catalyst. The most preferred brominated triazines are those represented by structures (1) and (2), below, where structure (1) corresponds to 2,4,6-tris(2,4,6-tribromophenoxy)-1,3,5-triazine (Chemical Abstracts Registry No. 25713-60-4), and structure (2) corresponds to 2,2'-[(1-methylethylidene)bis[(2,6-dibromo-4,1-phenylene)oxy]]bis[4,6-bis[(2,4,6-tribromophenyl)oxy]-1,3,5-triazine (Chemical Abstracts Registry No.329736-04-1).

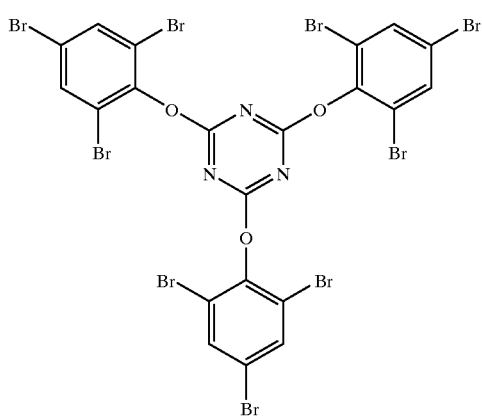

(1)

-continued

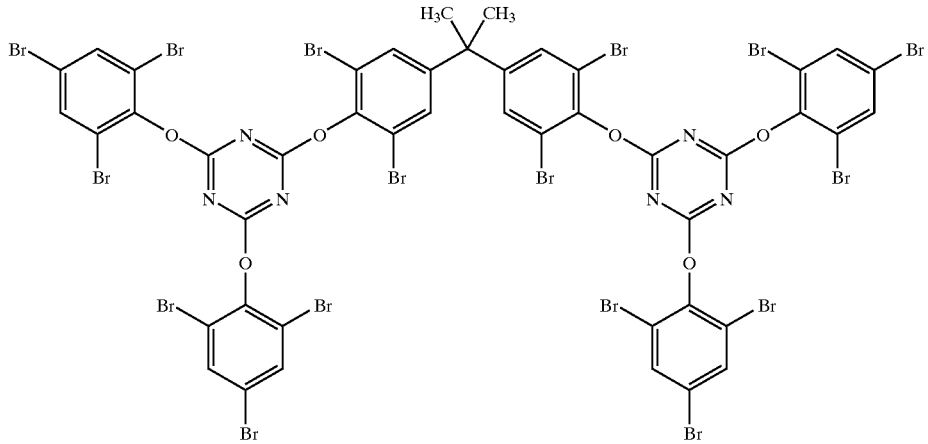

(2)

The flame retardant additive is essentially free of phenolic groups and of epoxy (oxirane) groups. This means that the flame retardant additive contains less than 1 wt-% phenolic group or epoxy group content.

Thermoplastic compounds useful in the inventive curable composition include those having Tg's greater than 120° C. because thermoplastics with lower Tg's have deleterious effect on the thermal performance of the cured composition. Representative of such preferred thermoplastic compounds include, for example, poly (phenylene ether) compounds, polyimides, and poly(styrene-co-maleic anhydride). Poly (phenylene ether) resins are commercially available as blends with homopolystyrene (Tg=100° C.) and as such are not suitable for the present invention because of the deleterious effects of the low Tg resin on thermal properties of the laminate. Thus, the present curable compositions are essentially free of styrene homopolymers, i.e., contain less than 1 wt-% styrene homopolymer content.

Poly(phenylene ether) compounds are the most preferred thermoplastic compounds for use in the novel curable composition and include all known poly (phenylene ether) compounds, poly(phenylene ether) copolymers, and derivatized poly (phenylene ether) resins synthesized therefrom. Poly(phenylene ether) compounds are described in the art in numerous patents and references, and generally contain recurring units of the following structure, (3)

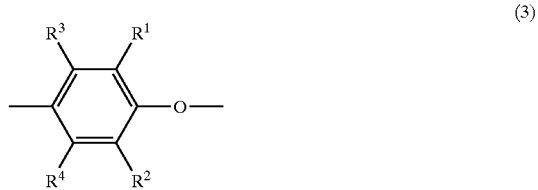

(3)

wherein $R^{1-4}$ independently are hydrogen; alkyl, alkenyl; alkynyl; aryl; mixed alkyl-, alkenyl-, or alkynyl-aryl hydrocarbons, and such groups optionally containing a substituent selected from one or more of a carboxylic acid, an aldehyde, an alcohol, and an amino substituent.

Useful copolymers include oxidative polymerization products of 2,6-dimethylphenol and 2,3,6-trimethylphenol. Derivatized resins include, for example, poly(phenylene ether) compounds containing pendant allylic, propargylic radicals, or end-group derivatized resins formed through, for example, reaction of the terminal hydroxyl groups of the poly(phenylene ether) with an acid chloride, ester, or anhydride. Typical of end-group derivatized resins are the reaction products of a poly (phenylene ether) with trimellitic anhydride acid chloride, methacrylic anhydride, or acrylic anhydride. Derivatized resins also include the reaction products produced by reaction of a poly(phenylene ether) with an unsaturated acid, anhydride, or a hydroxylated acid or anhydride which are most optimally prepared in the polymer melt by process such as by extrusion at temperatures of between about 200°–350° C. Exemplary reactants for such melt extrusion process include unsaturated acid, anhydride, or a hydroxylated acid or anhydride including maleic anhydride, maleic acid, citric acid, malic acid, and the like.

Preferred poly(phenylene ether) compounds for use in the present invention include low molecular weight poly (phenylene ether) compounds having number average molecular weights from about 1,000 to 10,000 g/mol, or weight average molecular weight of from about 3,000 to 35,000 g/mol. Such materials may be prepared using by oxidative polymerization of alkylated phenols by known procedures. Alternatively, these materials may be prepared by the reaction of a high molecular poly(phenylene ether) with a peroxide and a phenol, or with a peroxide alone. In a preferred embodiment, a high molecular weight poly (phenylene ether) with a number average molecular weight of about 45,000 g/mol is reacted in a toluene solution at about 50°–90° C. with benzoyl peroxide and bisphenol-A. Such low molecular weight polymers may be isolated by precipitation in a non-solvent, such as methanol, or more preferably by volatilization of the solvent and melt extrusion of the resulting polymer at temperatures from about 200°–300° C.

When using the preferred thermoplastic resin, poly (phenylene ether), it is advantageous to use a flame retardant additive that is mutually soluble in an aromatic hydrocarbon solvent, which preferably is toluene. The minimum amount of flame retardant required to achieve UL-94 V-0 flammability rating often is less than 30 parts by weight of the total composition. The preferred brominated flame retardants should have good solubility in aromatic hydrocarbon solvent of choice, say toluene, at temperatures below about 50° C. Generally, a solubility of 15 g/100 ml toluene at 50° C. is sufficient. Because of such toluene solubility, the preferred flame retardant resin compositions can be prepared as homogeneous solutions, which allows for uniform impregnation of a fibrous reinforcement. Thus, it is highly advantageous in the practice of the present invention to use toluene soluble brominated flame retardant additives with a poly(phenylene ether) thermoplastic compound, the epoxy resin and curing agents and catalysts therefor, in a toluene solvent or a mixture of solvents which contain greater than 50% by weight toluene, advantageously 80% by weight toluene, and preferably 100% toluene.

Other thermosetting resins optionally may be blended with the epoxy resin component in forming the curable composition disclosed herein including, for example, cyanate esters, bismaleimides, and unsaturated polyesters. Such thermosetting resins are known to the art and are disclosed in, for example, U.S. Pat. Nos. 4,604,452, 4,785,075, 4,902, 752, 4,983,683, 5,068,309, and 5,149,863.

Cyanate esters useful in the present invention include, for example, those that could be formed by replacement of glycidyl groups(—CH2CHOCH2) of epoxy resins with —CN groups. Useful cyanate ester compounds include, but are not limited to the following: 1,3- and 1,4-dicyanatobenzene; 2-tert-butyl-1,4-dicyanatobenzene; 2,4-dimethyl-1,3-dicyanatobenzene; 2,5-di-tert-butyl-1,4-dicyanatobenzene; tetramethyl-1,4-dicyanatobenzene; 4-chloro-1,3-dicyanatobenzene; 1,3,5-tricyanatobenzene; 2,2'- and 4,4'-dicyanatobiphenyl; 3,3',5,5'-tetramethyl-4,4'-dicyanatobiphenyl; 1,3-,1,4-,1,5-,1,6-,1,8-,2,6-, and 2,7-dicyanatonaphthalene; 1,3,6-tricyanatonaphthalene; bis(4-cyanatophenyl)methane; bis(3-chloro-4-cyanatophenyl) methane; bis(3,5-dimethyl-4-cyanatophenyl)methane; 1,1-bis(4-cyanatophenyl)ethane; 2,2-bis(4-cyanatophenyl) propane; 2,2-bis(3,3-dibromo-4-cyanatophenyl)propane; 2,2-bis(4-cyanatophenyl)-1,1,1,3,3,3-hexafluoropropane; bis(4-cyanatophenyl)ester; bis(4-cyanatophenoxy)benzene; bis(4-cyanatophenyl) ketone; bis(4-cyanatophenyl) thioether; bis(4-cyanatophenyl)sulfone; tris(4-cyanatophenyl)phosphate, and tris(4-cyanatophenyl) phosphate.

Also useful are cyanic acid esters derived from phenolic resins, e.g., as disclosed in U.S. Pat. No. 3,962,184; cyanated novolac resins derived from novolac, e.g., as disclosed in U.S. Pat. No. 4,022,755; cyanated bis-phenol-type polycarbonate oligomers derived from bisphenol-type polycarbonate oligomers, e.g., as disclosed in U.S. Pat. No. 4,026, 913; cyano-terminated polyarylene ethers, e.g., as disclosed in U.S. Pat. No. 3,595,900; dicyanate esters free of ortho hydrogen atoms, e.g., as disclosed in U.S. Pat. No. 4,740, 584; mixtures of di- and tricyanates, e.g., as disclosed in U.S. Pat. No. 4,709,008; polyaromatic cyanates containing polycyclic aliphatic groups, e.g., as disclosed in U.S. Pat. No. 4,528,366, e.g., QUARTEX™ 7187, available from Dow Chemical Company (Midland, Mich.); fluorocarbon cyanates, e.g., as disclosed in U.S. Pat. No. 3,733,349; and cyanates, e.g., as disclosed in U.S. Pat. Nos. 4,195,132 and 4,116,946, all of the foregoing patents being expressly incorporated herein by reference.

Cyanic acid esters derived from phenolic resins, such as those disclosed in U.S. Pat. No. 3,962,184 to Notomi et al., include those having the formula

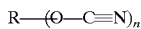

wherein R is an aromatic nucleus-containing residue which is selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

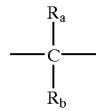

wherein $R_a$ and $R_b$ are the same or different and each represents a hydrogen atom or an alkyl group containing 1 to 4 carbon atoms,

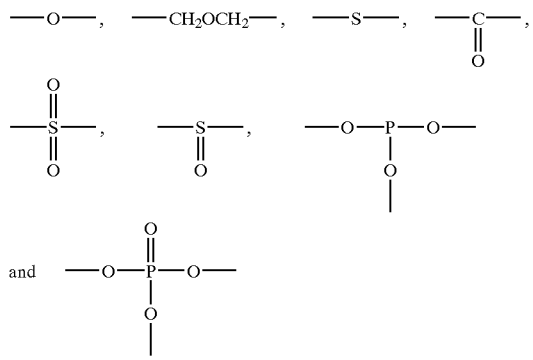

and a residue resulting from the removal of a phenolic hydroxyl group from a novolac-type or resol-type phenolic resin skeleton; said aromatic nucleus is optionally substituted by a substituent selected from the group consisting of alkyl groups containing 1 to 4 carbon atoms, alkoxy groups containing 1 to 4 carbon atoms, chlorine and bromine; n is an integer of 2 to 5; and the cyanate group is always directly bonded to the aromatic nucleus, and prepolymers of the said cyanic acid esters which have a triazine ring and an average molecular weight of 400 to 6,000, and are formed by trimerizing the cyanate group of the cyanic acid esters.

Cyanated novolac resins, such as those described in U.S. Pat. No. 4,022,755 to Tanigaichi et al. include cyanate-group-containing phenol resins comprising a mixture of polymers represented by the formula

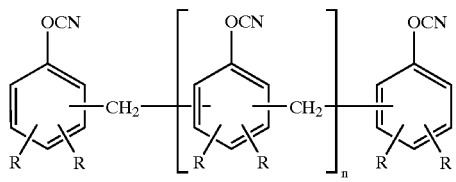

wherein n is 0 or an integer of 1 or more; and R's may be the same or different, and each R is a hydrogen atom or a methyl group, and containing 50% by weight or more in total of polymers having formula in which n is an integer of 1 to 3, the number average molecular weight of said phenol resin being 350 to 700, as determined by gel permeation chromatography using tetrahydrofuran as solvent.

Cyanated bis-phenol-type polycarbonate oligomers, such as those disclosed in U.S. Pat. No. 4,026,913 to Tanigaichi et al., include a cyanic acid ester of an aromatic polycarbonate obtained by reacting an aromatic polycarbonate having one or two terminal hydroxyl groups with a cyanogen halide, wherein the aromatic polycarbonate is prepared from an aromatic dihydroxy compound represented by one of the following formulas:

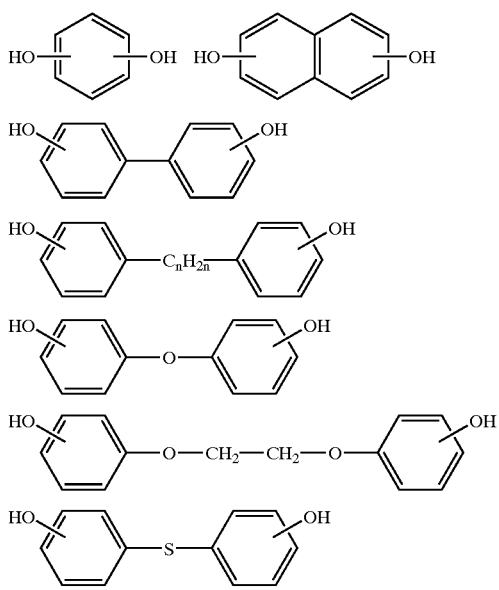

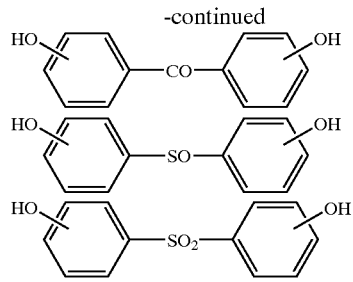

where n is an integer of 1–4, inclusive, or a mono-, di-, tri- or tetra-halogeno-nuclear substituted derivative of the aromatic dihydroxy compound represented by one of the above formulas.

Cyano-terminated polyarylene ethers, such as those disclosed in U.S. Pat. No. 3,595,900, include cyanatophenyl-terminated polyarylene ethers of the formula

NCO—R—OCN where R is a divalent radical having 3 to 15 aromatic nuclei linearly linked together with ethereal oxygen atoms, said nuclei comprising nuclei selected from the group consisting of.

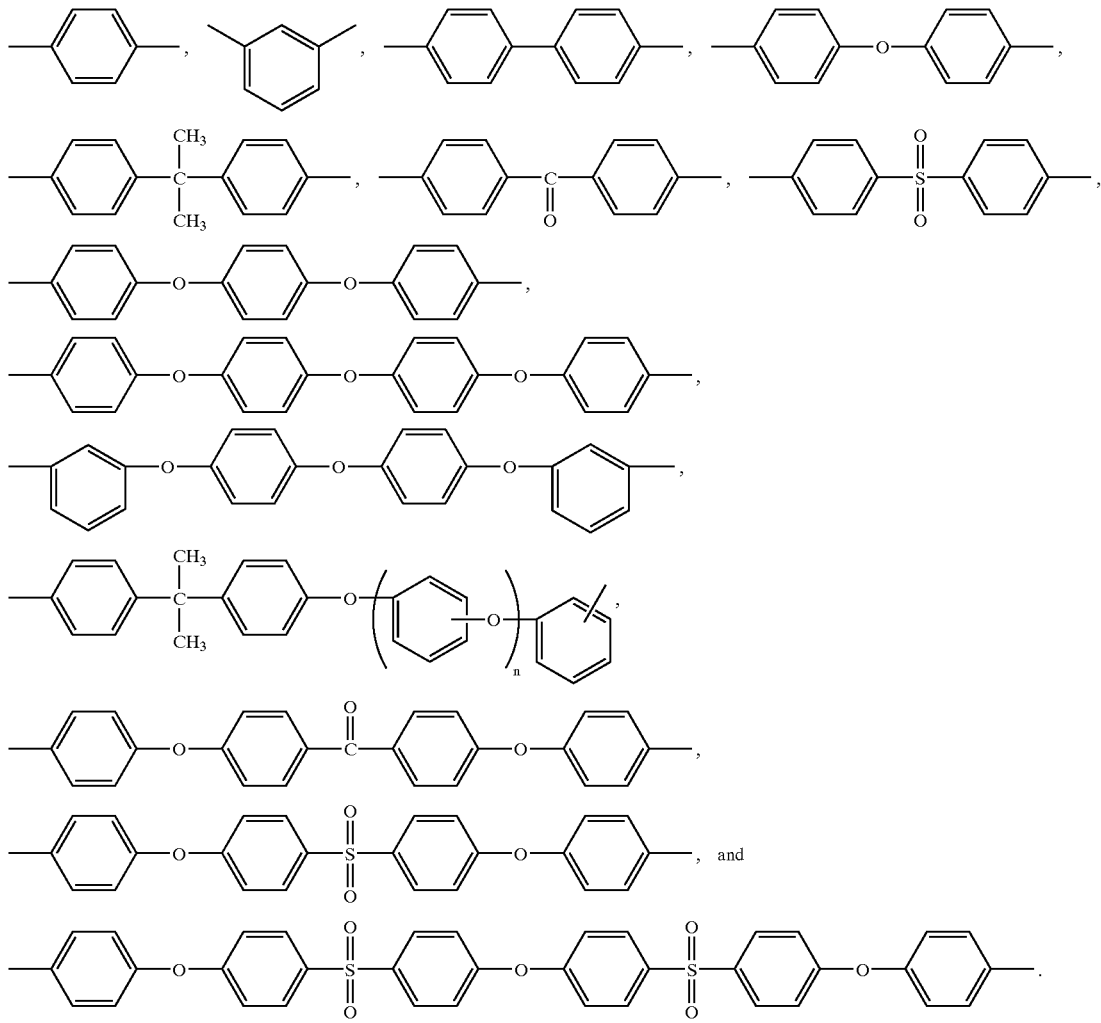

Dicyanate esters free of ortho hydrogens, such as those disclosed in U.S. Pat. No. 4,740,584 to Shimp, include those having the formula

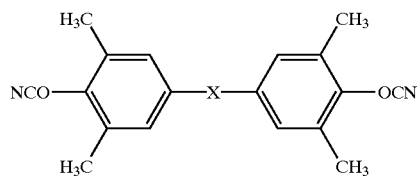

wherein X is methylene, isopropylidene, oxygen or divalent sulfur.

Mixtures of di- and tricyanates, such as those disclosed in U.S. Pat. No. 4,709,008 to Shimp, include a blend of a tricyanate ester and a dicyanate ester, wherein the tricyanate ester has the structural formula:

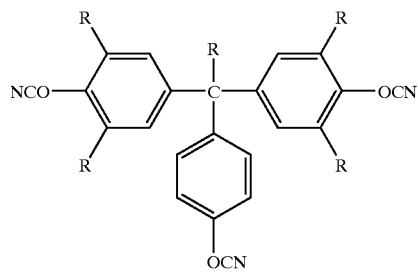

and the dicyanate ester has the structural formula:

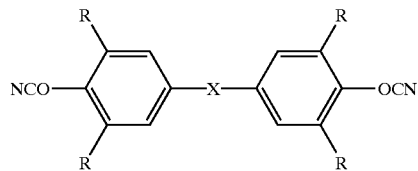

wherein each R is H or methyl and is the same or different and wherein X is methylene, alkylidene having 2 to 4 carbon atoms, divalent oxygen (—O—), or divalent sulfur (—S—).

Polyaromatic cyanates containing polycyclic aliphatic groups, such as those described in U.S. Pat. No. 4,528,366 to Woo et al., include polyaromatic cyanates having the formula

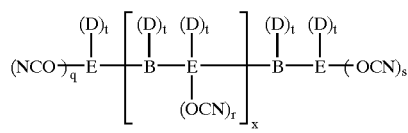

wherein B is a $C_{7-20}$ polycyclic aliphatic radical; D is any nonactive hydrogen-containing substituent; E is an aromatic radical; q, r and s are independently in each occurrence the integers 0, 1, 2, or 3; with the proviso that the sum of q, r and s is greater than or equal to 2; t is independently in each occurrence an integer of between about 0 and 4; and x is a number between about 0 and 5.

Aromatic radical, refers herein to any radical containing an aromatic group. Examples of aromatic radicals include benzene, naphthalene, phenanthracene, anthracene, or biaromatic radicals, or two or more aromatic radicals bridged by alkylene moieties. Preferable aromatic radicals include benzene, naphthalene, biphenyl, binaphthyl, or diphenylalkylene radicals. A more preferred aromatic radical is a benzene radical.

Polycyclic aliphatic radical refers herein to any aliphatic radical which contains two or more cyclic rings. The polycyclic aliphatic radicals may contain one or more double or triple bonds. Preferred polycyclic aliphatic radicals correspond to the formulas

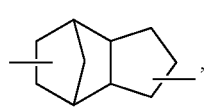
(4)

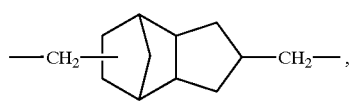
(5)

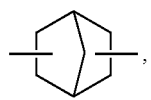
(6)

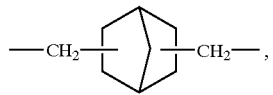
(7)

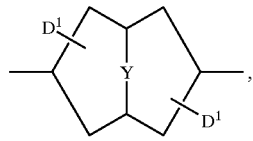
(8)

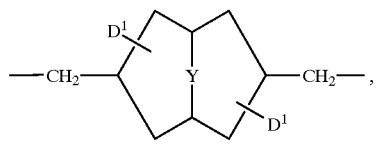
(9)

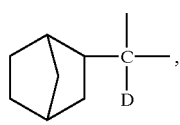
(10)

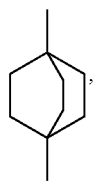
(11)

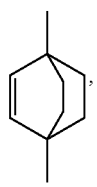
(12)

-continued

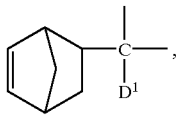
(13)

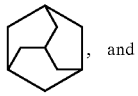, and
(14)

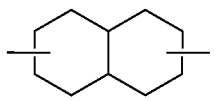
(15)

wherein
Y is CH$_2$, S,

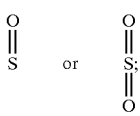

and D$^1$ is C$_{1-5}$ alkyl.

B is more preferably a radical which corresponds to one of the formulas (4), (5), (6), (7), (8), (9), (10) or (15) with radicals corresponding to formulas (4), (5), (6), (7) or (15) being even more preferred, and radicals corresponding to formula (4) being most preferred.

D is any substituent which can be substituted on an organic hydrocarbon radical, with the exception that the substituent cannot contain an active hydrogen atom. Substituents within the scope of this invention are well-known to those skilled in the art. Active hydrogen atom means herein a hydrogen atom which is bonded to an oxygen, sulfur or nitrogen atom. Examples of substituents within the scope of D include alkyl, alkenyl, alkynyl, aryl, alkaryl aralkyl, halo, alkoxy, nitro, carboxylate, sulfone, sulfide or carbonate moieties. Preferred substituents are C$_{1-10}$ alkyl, C$_{1-10}$ alkenyl, nitro, and halo moieties, with C$_{1-3}$ alkyl, C$_{1-3}$ alkynyl, bromo and chloro moieties being most preferred.

Preferably, q, r and s are independently 1 or 2, and are most preferably 1. Preferably, t is independently an integer of 0, 1 or 2, more preferably 0 or 1, and most preferably 0. Preferably, x is between about 0 and 2 inclusive, and more preferably between about 0 and 1 inclusive.

The polyaromatic cyanates of this invention usually exist as a mixture of many isomers. Further, these polyaromatic cyanates usually are found as a mixture of compounds in which x is between 0 and 5. Usually the number given for x in a particular mixture is an average number.

In one preferred embodiment the polyaromatic cyanates correspond to the formula

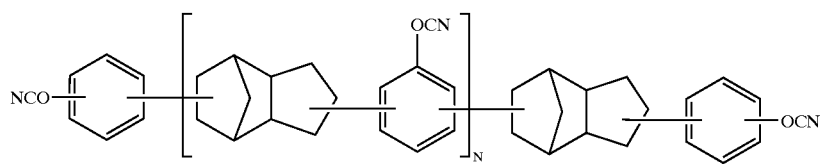

wherein x is a real number of between about 0 and 5, inclusive.

Fluorocarbon cyanates, such as those described in U.S. Pat. No. 3,733,349 to Loudas et al., include fluorocarbon monocyanate having the structure

where A is

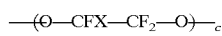

X is fluorine or perfluoroalkyl having 1 to 10 carbon atoms, a is 1 to 10, h is 1, and c is 1 to 100.

Fluorocarbon cyanates further include fluorocarbon dicyanates having the structure

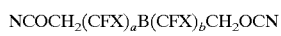

where B is (I) a carbon-to-carbon bond, in which case a is an integer of 1 to 30 and b is zero, or (II) B is [(CFX)$_d$O (CFX)$_e$]$_f$, in which case a and b are zero, d and e are integers of 1 to 30, and f is an integer of 1 to 20, or (III) B is

in which case a and b are 1, h is an integer of 1 to 10, and g and i are integers of 1 to 100, or (IV) B is

in which case a and b are integers of 1 to 10, j and k are integers whose ratio j/k is 1/1 to 10/1, m is an integer of 1 to 100, and (CF$_2$CH$_2$) and (CF$_2$—CFX) are randomly distributed units; and where X in all instances where it appears is fluorine or perfluoroalkyl of 1 to 10 carbon atoms.

Cyanate esters further include those, as described in U.S. Pat. No. 4,116,946, having the formula

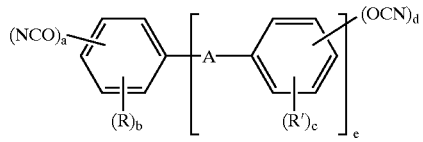

in which R represents hydrogen, halogen (fluorine, chlorine, bromine, iodine), linear or branched C$_1$–C$_9$-alkyl or phenyl, two adjacent radicals R on the same nucleus together forming a carbocyclic 5-membered or 6-membered ring or together and in conjunction with a hetero atom (O, S, N) forming a 5-membered or 6-membered heterocyclic ring, alkoxy radicals with 1 to 4 carbon atoms, alkoxy carbonyl radicals with 1 to 4 carbon atoms in the alkyl group; R' has the same meaning as R or represents the group

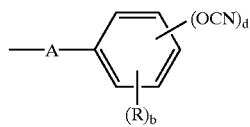

where A is direct bond, a $C_1$–$C_9$-alkylene group optionally substituted by $C_1$–$C_4$-alkyl or phenyl, a cycloaliphatic or aromatic 5-membered or 6-membered ring, a cycloaliphatic or aromatic 5-membered or 6-membered ring, interrupted by an oxygen atom, oxygen, the sulphonyl group (—$SO_2$—), the carbonyl dioxy group

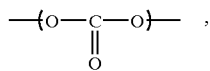

the carbonyl group; a is a number from 0 to 5 where e=1 and a number from 2 to 5 where e=0; b=5–a where e=1 and 6–(a+d) where e=0; c=5–d; d is a number from 0 to 5; e is the number 0, 1, 2 or 3; with the proviso that the sum of a and d (a+d) always gives a number from 2 to 5.

Polycyanate compounds obtained by reacting a phenol-formaldehyde precondensate with a halogenated cyanide also may be useful for present purposes. Examples of preferred cyanate ester resin compositions include low molecular weight (Mn) oligomers, e.g., from about 250 to about 5000, e.g., bisphenol-A dicyanates such as AroCy™ "B-30 Cyanate Ester Semisolid Resin"; low molecular weight oligomers of tetra o-methyl bis-phenol F dicyanates, such as "AroCy™; M-30 Cyanate Ester Semisolid Resin"; low molecular weight oligomers of thiodiphenol dicyanates, such as AroCy™ "T-30", all of the foregoing being commercially available from Ciba-Geigy Corp., Hawthorne, N.Y.

Bismaleimide resins include, for example, resins derived from aromatic diamines, such as those described in U.S. Pat. No. 4,389,516. Generally, bismaleimides are synthesized, for example, by reacting a diluted ether solution of a diamine to a similar diluted ether solution of maleic anhydride to form a maleamic acid, which can be disposed in acetic anhydride and converted to the corresponding bismaleimide in the presence of potassium acetate (see U.S. Pat. No. 2,444,536).

Reinforcements known to one skilled in the art can be used, including but not limited to, inorganic and organic materials, such as woven or non-woven glass fabrics of the E-, NE-, S-, T- and D-type glasses and quartz, and the like. They may be in the form of glass roving cloth, glass cloth, chopped glass, hollow glass fibers, glass mat, glass surfacing mat, and non-woven glass fabric, ceramic fiber fabrics, and metallic fiber fabrics. In addition, synthetic organic reinforcing fillers may also be used in the present invention including, for example, organic polymers capable of forming fibers. Illustrative examples of such reinforcing organic fibers include, for example, poly (ether ketone), polyimide benzoxazole, poly(phenylene sulfide), polyesters, aromatic polyamides, aromatic polyimides or polyetherimides, acrylic resins, and poly(vinyl alcohol). Fluoropolymers such as polytetrafluoroethylene, can be used in the present invention. Also included as reinforcement are natural organic fibers known to those skilled in the art, including cotton cloth, hemp cloth, felt, carbon fiber fabrics, and natural cellulosic fabrics such as Kraft paper, cotton paper; and glass fiber containing paper. Such reinforcing fillers may be provided in the form of monofilament or multifilament fibers and could be used either alone or in combination with another type of fiber, through, for example, co-weaving or core/sheath, side-by-side, orange-type or matrix and fibril constructions, or by other methods known to one skilled in the art of fiber manufacture. Such fillers could be supplied in the form of, for example, woven fibrous reinforcements, non-woven fibrous reinforcements, or papers.

Coupling agents, incorporated into the reinforcing material, are known in the art to improve adhesion of the fibrous reinforcement to the cured resin composition. For the purposes of the present invention, representative coupling agents include, for example, silane-, titanate-, zirconate-, aluminum-, and zircoaluminum-based coupling agents, as well as other agents known to those skilled in the art.

Among the other materials that may be present are inert, particulate fillers such as talc, clay, mica, silica, alumina, and calcium carbonate. Fabric wettability enhancers (e.g. wetting agents and coupling agents) and polar liquids such as n-butyl alcohol, methyl ethyl ketone, polysiloxanes, and tetrahydrofuran, may be advantageous under certain conditions. Such materials as antioxidants, thermal and ultraviolet stabilizers, lubricants, antistatic agents, dyes, and pigments also may be present.

The curable compositions of the invention are dissolved in an effective amount of an inert organic solvent, typically to a solute content of about 30%–60% by weight. The identity of the solvent is not critical, provided it may be removed by suitable means such as evaporation. Examples of suitable solvents include aromatic hydrocarbons, such as toluene or xylene, cycloaliphatic ethers such as tetrahydrofuran, chlorinated hydrocarbons such as chloroform, amides such as dimethylformamides, or mixtures of the above solvents with an aromatic or chlorinated hydrocarbon, ketone, ether, amide other solvent known to the art. Aromatic hydrocarbons, especially toluene, are useful in the preferred embodiment where the thermoplastic resin is a poly(phenylene ether). The order of blending and dissolution also is not critical; however, in order to avoid premature curing, catalyst and curing agent (hardener) components generally should not be brought initially into contact with polyphenylene ether and polyepoxides at a temperature below about 50° C. Proportions of components and bromine herein do not include solvent.

In this application all amounts and proportions are by weight and units are in the metric system, unless otherwise indicated. Also, all citations referred to herein are expressly incorporated herein by reference.

EXAMPLE

Poly(phenylene ether) resin (η=0.12 dl/g) was prepared by reacting a 0.40 IV PPO resin (100 parts) in toluene (300 parts) with benzoyl peroxide (4 parts) and bisphenol-A (4 parts) at 80° C. The resin was then isolated from solution by precipitation into methanol followed by filtration and drying at 80° C. overnight in vacuo. The resulting poly(phenylene ether) resin (Mn=4,329; Mw=12,801) was dissolved in toluene to which was added various epoxy resins, brominated triazine flame retardant additive, and curing catalysts to a solids content of 50% by weight. Glass fabric (7628 style E-glass) was then impregnated with the resin solution and the resulting impregnated glass cloth heated at 180° C. to remove the excess solvent and partially cure the thermoset resin. Eight of these partially cured, glass reinforced articles or prepregs then were layered and cured at 200° C. for 3 hours to generate the resulting laminate. As shown below a flame retardant laminate with acceptable thermal properties and low dissipation factor and dielectric constant may be produced in this manner, making them useful for printed circuit board applications.

TABLE 1

| Formulation | Weight-Parts |
|---|---|
| Component 1 | |
| PPE (0.13 IV) | 26.3 |
| Component 2 | |
| Tris (2,4,6-tribromophenoxytriazine); (1) | 26.3 |
| Component 3 | |
| Epoxidized cresol formaldehyde novolac | 43.8 |
| Component 4 | |
| Zinc Octoate | 3.5 |
| 2-ethly-4-methyl imidazole (2,4-EMI) | 0.1 |
| Properties: | |
| Tg (TMA, ° C.) | 131 |
| Laminate Integrity | Good |
| MeCl$_2$ resistance (30 min, RT) | Good |
| CTE (below Tg; TMA) | 54 |
| CTE (above Tg; TMA) | 319 |
| Z-axis expansion (%) | 5.4% |
| UL-94 | V-0 |
| Dielectric Constant (1 MHz) | 4.37 |
| Dissipation Factor (1 MHz) | 0.0039 |

What is claimed is:

1. A curable composition, comprising:
   (a) an epoxy resin and curing agent therefor, wherein said epoxy resin is essentially free of bromine atoms;
   (b) a flame retardant additive essentially free of phenolic groups and of epoxy group, wherein said flame retardant is a condensation product of (i) a brominated phenol or a mixture of brominated phenols with (ii) a cyanuric halide;
   (c) a thermoplastic resin; and
   (d) a cyanate ester.

2. The curable composition of claim 1, wherein said flame retardant additive has a bromine content greater than 20%.

3. The curable composition of claim 1, wherein said flame retardant additive is 1,3,5-tris(2,4,6-tribromophenoxy) triazine.

4. The curable composition of claim 1, wherein said flame retardant additive is 2,2'-[(1-methylethylidene)bis[(2,6-dibromo-4,1-phenylene)oxy]]bis[4,6-bis[(2,4,6-tribromophenyl)oxy]-1,3,5-triazine].

5. The curable composition of claim 1, wherein said flame retardant additive is soluble in teluene at a concentration of greater than 15 g/100 ml of toluene at a temperature of 50° C.

6. A curable composition, comprising:
   (a) an epoxy resin and curing agent therefor, wherein said epoxy resin is essentially free of bromine atoms, and wherein said epoxy resin is a glycidyl ether resin or a mixture of glycidyl ether resins containing, on average, greater than 2 epoxy groups per molecule;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin; and
   (d) a cyanate ester.

7. A curable composition, comprising:
   (a) an epoxy resin and curing agent therefor, wherein said epoxy resin is essentially free of bromine atoms, and wherein said epoxy resin is a mixture of:
      (a1) an epoxy resin containing on average less than or equal to 2 glycidyl groups per molecule; and
      (a2) an epoxy resin containing greater than 2 glycidyl groups per molecule;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic; and
   (d) a cyanate ester.

8. A curable composition, comprising:
   (a) an epoxy resin and curing agent therefor, wherein said epoxy resin is essentially free of bromine atoms;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin, wherein said thermoplastic resin has a Tg greater than 120° C.; and
   (d) a cyanate ester.

9. A curable composition, comprising:
   (a) an epoxy resin and curing agent thereof, wherein said epoxy resin is essentially free of bromine atoms;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin, wherein said thermoplastic resin has a dissipation factor of less than 0.010 measured at 1 MHz at room temperature; and
   (d) a cyanate ester.

10. A curable composition, comprising:
    (a) an epoxy resin and curing agent therefor, wherein said epoxy resin is essentially free of bromine atoms;
    (b) a flame retardant additive essentially free of phenolic groups and of epoxy groups, wherein said flame retardant is a condensation product of (i) a bominated phenol or a mixture of brominated phenols with (ii) a cyanuric halide;
    (c) a thermoplastic resin, wherein said thermoplastic resin has been directly isolated from solution after polymerization; and
    (d) a cyanate ester.

11. A curable composition, comprising:
    (a) an resin and curing agent therefor, wherein said epoxy resin is essentially free of bromine atoms;
    (b) a flame retardant additive essentially free of phenolic groups and of epoxy groups, wherein said flame retardant is a condensation product of (i) a brominated phenol or a mixture of brominated phenols with (ii) a cyanuric balide;
    (c) a thermoplastic resin, wherein said thermoplastic resin is a poly(phenylene ether); and
    (d) a cyanate ester.

12. A curable composition, comprising:
    (a) an epoxy resin and curing agent therefor, wherein said epoxy resin is essentially free of bromine atoms;

(b) a flame retardant additives essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a poly(phenylene ether), and wherein said poly(phenylene ether) has a weight average molecular weight ranging from about 3,000 to 35,000 g/mol; and
(d) a cyanate ester.

13. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a poly(phenylene ether), and wherein said poly(phenylene ether) has a number average molecular weight ranging from about 1,000 to 10,000 g/mol; and
(d) a cyanate ester.

14. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a poly(phenylene ether), and wherein said poly(phenylene ether) has been melt processed at a temperature ranging from about 200° to 350° C.; and
(d) a cyanate ester.

15. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a poly(phenylene ether), and wherein said poly(phenylene ether) is hydroxy functional; and
(d) a cyanate ester.

16. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is one or more of a poly(phenylene ether) or a poly(styrene-co-maleic anhydride); and
(d) a cyanate ester.

17. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a reaction product of a poly(phenylene ether) and a peroxide; and
(d) a cyanate ester.

18. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a reaction product of a poly(phenylene ether), a peroxide, and a bisphenol; and
(d) a cyanate ester.

19. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin, wherein said thermoplastic resin is a polyimide; and
(d) a cyanate ester.

20. A curable composition, comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin;
(d) a cyanate ester; and
one or more of an organic reinforcement, an inorganic reinforcement, or a filler.

21. The curable composition of claim 1, wherein the curable composition is essentially free of homopolymers of styrene.

22. A curable composition, comprising:
(a) an epoxy resin and agent therefor, wherein the epoxy resin is essentially free of bromine atoms, and wherein the epoxy resin is a multifunctional glycidyl ether;
(b) a flame retardant additive essentially free of phenolic groups and of epoxy groups, wherein said flame retardant is a condensation product of (i) a brominated phenol or mixture of brominated phenols with (ii) a cyanuric halide;
(c) a thermoplastic resin; and
(d) a cyanate ester.

23. A curable composition, comprising:
(a) an epoxy resin and curing agent therefor; wherein the epoxy resin is essentially free of bromine atoms, and wherein the epoxy resin is a multifunctional glycidyl ether; and wherein said the multifunctional glycidyl ether is selected from the group consisting of epoxidized phenol-formaldehyde novolacs, epoxidized cresol-formaldehyde novolacs, epoxidized-alkylphenol-formaldehyde novolacs, epoxidized 1,1,1-tris(4-hydroxyphenyl)ethane, epoxidized 1,1,2,2-tetra (4-hydroxyphenyl) ethane, epoxidized phenol-dicyclopentadiene novolacs, and epoxidized phenol-benzaldehyde novolacs;

(b) a flame retardant additive essentially free of phenolic groups ad of epoxy groups, wherein said flame retardant is a condensation product of (i) a brominated phenol or a mixture of brominated phenols with (ii) a cyanuric halide;

(c) a thermoplastic resin; and (d) a cyanate ester.

24. A curable composition, comprising:

(a) an epoxy resin and curing agent therefor, wherein the epoxy resin is essentially free of bromine atoms;

(b) a flame retardant additive essentially free of phenolic groups and of epoxy groups, wherein said flame retardant is a condensation product of (i) a brominated phenol or a mixture of brominated phenol with (ii) a cyanuric halide;

(c) a thermoplastic resin; and (d) a cyanate ester; wherein the cyanate ester is selected from the group consisting of 1,3-dicyanatobenzene, 1,4-dicyanatobenzene, 2-tert-butyl-1,4-dicyanatobenzene, 2,4-dimethyl-1,3-dicyanatobenzene, 2,5-di-tert-butyl-1,4-dicyanatobenzene, tetramethyl-1,4-dicyanatobenzene, 4-chloro-1,3-dicyanatobenzene, 1,3,5-tricyanatobenzene, 2,2'-dicyanatobiphenyl, 4,4'-dicyanatobiphenyl, 3,3',5,5'-tetramethyl1,4,4'-dicyanatobiphenyl, 1,3-dicyanatonaphthalene, 1,4-dicyanatonaphthalene, 1,5-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, bis(4-cyanatophenyl)methane, bis(3-chloro-4-cyanatophenyl)methane, bis(3,5-dimethyl-4-cyanatophenyl)methane, 1,1-bis(4,-cyanatophenyl)ethane, 2,2-bis(4-cyanatophenyl)propane, 2,2-bis(3,3-dibromo-4-cyanatophenyl)propane, 2,2-bis(4-cyanatophenyl)-1,1,1,3,3,3-hexafluoropropane, bis(4-cyanatophenyl)ester, bis(4-cyanatophenoxy)benzene, bis(4-cyanatophenyl)ketone, bis(4-cyanatophenyl)thioether, bis(4-cyanatophenyl)sulfone, tris(4-cyanatophenyl)phosphate, and tris(4-cyanatophenyl)phosphate.

25. A curable composition, comprising:

(a) an epoxy resin and curing agent therefor, wherein the epoxy resin is essentially free of bromine atoms;

(b) a flame retardant additive essentially free of phenolic groups and of epoxy groups, wherein said flame retardant is a condensation product of (i) a brominated phenol or a mixture of brominated phenols with (ii) a cyanuric halide;

(c) a thermoplastic resin; and (d) a cyanate ester; wherein the cyanate ester has the formula

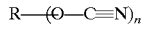

wherein R is an aromatic nucleus-containing residue which is selected from the group consisting of a residue derived from an aromatic hydrocarbon selected from the group consisting of benzene, biphenyl and naphthalene, a residue derived from a compound in which at least two benzene rings are bonded to each other by a bridging member selected from the group consisting of

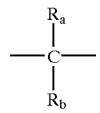

wherein $R_a$ and $R_b$ are the same or different and each represents a hydrogen atom or an alkyl group containing 1 to 4 carbon atoms,

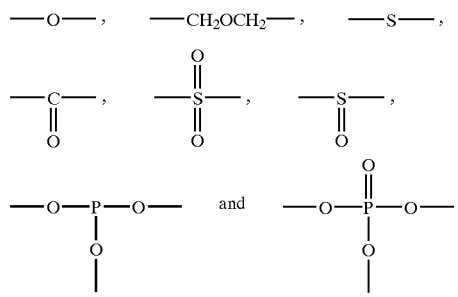

and a residue resulting from the removal of a phenolic hydroxyl group from a novolac-type or resol-type phenolic resin skeleton; said aromatic nucleus is optionally substituted by a substituent selected from the group consisting of alkyl groups containing 1 to 4 carbon atoms, alkoxy groups containing 1 to 4 carbon atom, chlorine and bromine; n is an integer of 2 to 5; and the cyanate group is always directly bonded to the aromatic nucleus.

26. A curable composition, comprising:

(a) an epoxy resin and agent therefor, wherein the epoxy resin is essentially free of bromine atoms;

(b) a flame retardant additive essentially free of phenolic groups and of epoxy groups, wherein said flame retardant is a condensation product of (i) a brominated phenol or mixture of brominated phenols with (ii) a cyanuric halide;

(c) a thermoplastic resin; and (d) a cyanate ester; wherein the cyanate ester is a prepolymer of having a number average molecular weight of 400 to 6,000, and wherein the prepolymer is formed by trimerizing the cyanate group of a cyanate ester having the formula

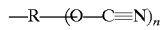

wherein R is an aromatic nucleus-containing residue which is selected from the group consisting of a residue derived from an aromatic hydrocarbon selected from the group consisting of a benzene, biphenyl and naphthalene, a residue derived from a compound in which at least two benzene ring are bonded to each other by a bridging member selected from the group consisting of

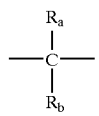

wherein $R_a$ and $R_b$ are the same or different and each represents a hydrogen atom or an alkyl group containing 1 to 4 carbon atoms,

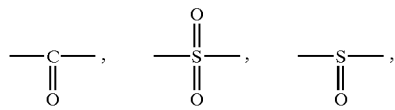

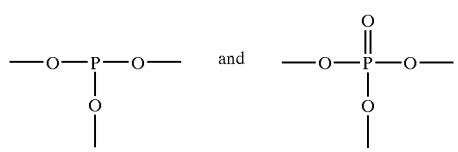

and a residue resulting from the removal of a phenolic hydroxyl group from a novolac-type type or resol-type phenolic resin skeleton; said aromatic nucleus is optionally substituted by a substituent selected from the group consisting of alkyl groups containing 1 to 4 carbon atoms, alkoxy groups containing 1 to 4 carbon atoms, chloride and bromine; n is an integer of 2 to 5: and the cyanate group is always directly bonded to the aromatic nucleus.

27. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; and
(d) a cyanate ester; wherein the cyanate ester is a cyanate-group-containing phenol resin comprising a mixture of polymers represented by the formula

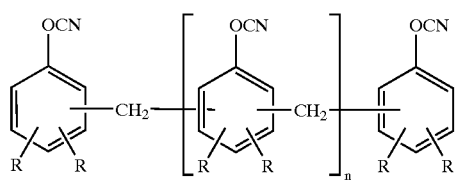

wherein n is 0 or an integer of 1 or more; and R's may be the same or different, and each R is a hydrogen atom or a methyl group, and containing 50% by weight or more in total of polymers having formula in which n is an integer of 1 to 3, the number average molecular weight of said phenol resin being 350 to 700 g/mole.

28. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; and
(d) a cyanate ester; wherein the cyanate ester is a cyanic acid ester of an aromatic polycarbonate obtained by reacting an aromatic polycarbonate having one or two terminal hydroxyl groups with a cyanogen halide, wherein the aromatic polycarbonate is prepared from an aromatic dihydroxy compound represented by one of the following formulas:

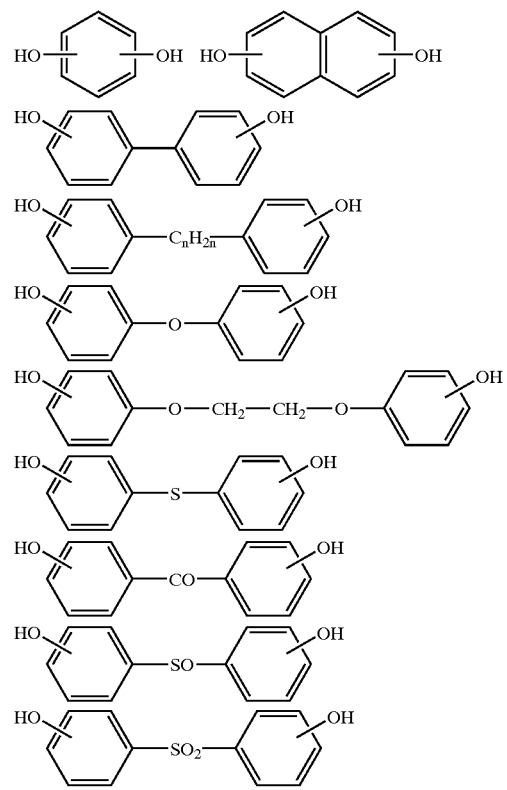

where n is an integer of 1–4, inclusive, or a mono-, di-, tri- or tetra-halogeno-nuclear substituted derivative of the aromatic dihydroxy compound represented by one of the above formulas.

29. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; and
(d) a cyanate ester; wherein the cyanate ester is a cyanatophenyl-terminated polyarylene other of the formula

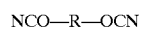

where R is a divalent radical having 3 to 15 aromatic nuclei linearly linked together with ethereal oxygen atoms, said nuclei comprising nuclei selected from the group consisting of

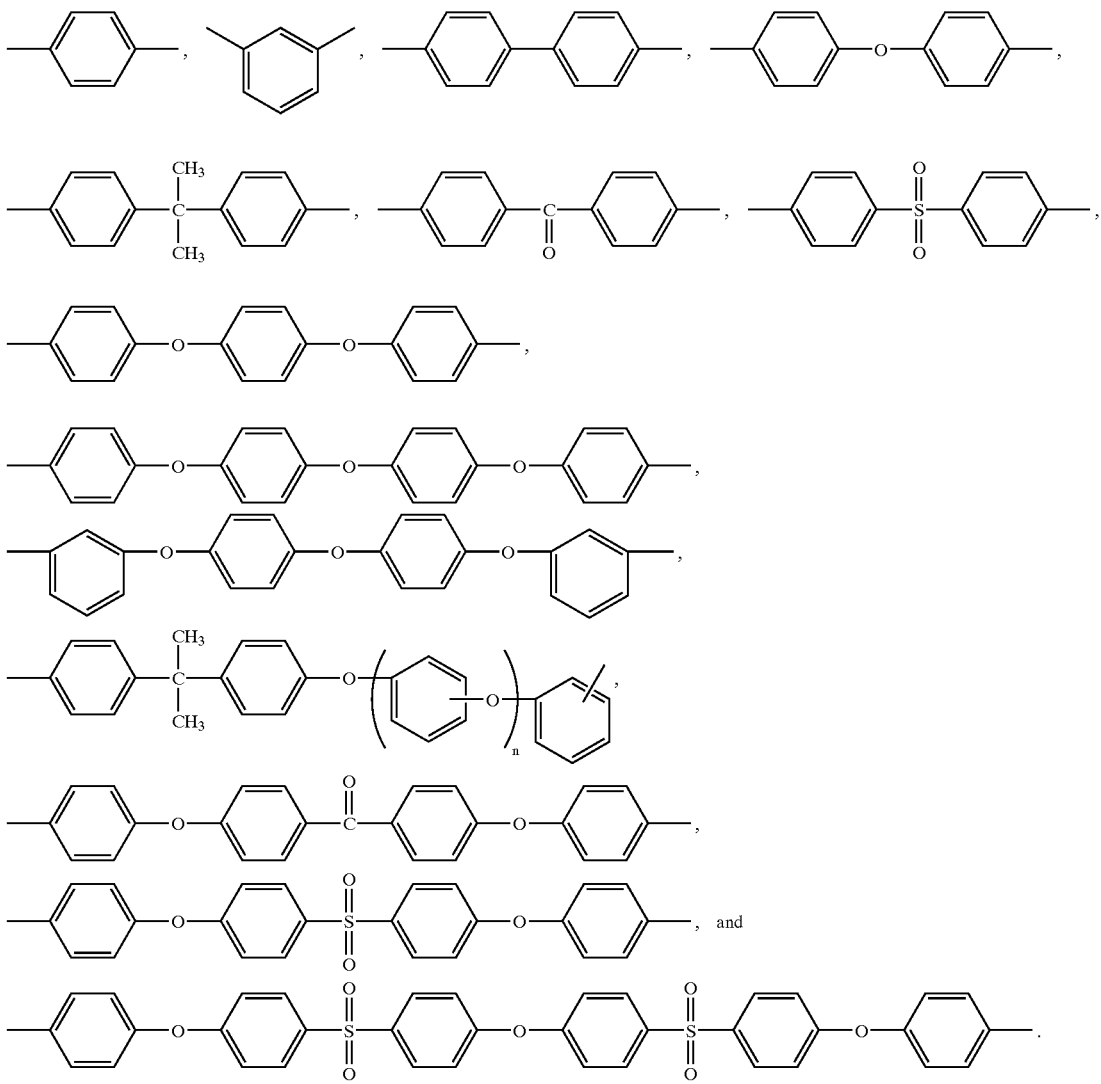

30. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) brominated phenol or a mixture of brominated phenols with (ii) a cyanuric halide;
(c) a thermoplastic resin; and
(d) a cyanate ester; wherein the cyanate ester has the structure

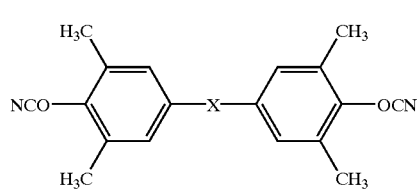

wherein X is methylene, isopropylidene, oxygen or divalent sulfur.

31. A curable composition, comprising:
(a) an epoxy resin and curing agent therefor, wherein the epoxy resin is essentially free of bromine atoms;
(b) a flame retardant additive essentially free of phenolic groups and of epoxy groups, wherein flame retardant is a condensation product of (i) a brominated phenol or a mixture of brominated phenols with (ii) a cyanuric halide;
(c) a thermoplastic resin; and
(d) a cyanate ester; wherein the cyanate ester is a blend of a tricyanate ester and a dicyanate ester, wherein the tricyanate ester has the structural formula:

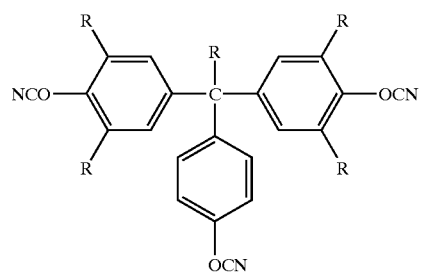

and the dicyanate ester has the structural formula:

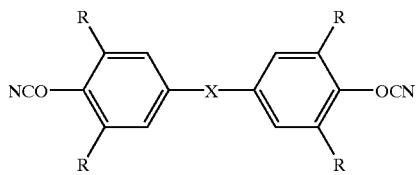

wherein each R is H or methyl and is the same or different and wherein X is methylene, alkylideno having 2 to 4 carbon atoms, divalent oxygen, or divalent sulfur.

32. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; and
(d) a cyanate ester; wherein the cyanate ester is a polyaromatic cyanate having the formula

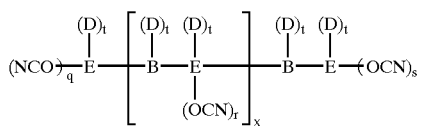

wherein E is an aromatic radical;
B is a $C_{7-20}$ polycyclic aliphatic radical;
D is independently in each occurrence any nonactive hydrogen-containing substituent;
q, r and a are independently in each occurrence the integers 0, 1, 2, or 3; with the proviso that the sum of q, r and s is greater than or equal to 2;
t is independently in each occurrence an integer of between about 0 and 4 inclusive; and
x is a number between about 0 and 5 inclusive.

33. A curable composition, comprising:
(a) an epoxy resin and agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic; and
(d) a cyanate ester; wherein the cyanate ester is a fluorocarbon monocyanate having the structure $$F_3C(CFX)_aA(CFX)_hCH_2OCN$$

where A is

X is fluorine or perfluoroalkyl having 1 to 10 carbon atoms, a is 1 to 10, h is 1, and c is 1 to 100.

34. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; and
(d) a cyanate ester; wherein the cyanate ester is a fluorocarbon dicyanate having the structure $$NCOCH_2(CFX)_aB(CFX)_bCH_2OCN$$

where B is (I) a carbon-to-carbon bond, in which case a is an integer of 1 to 30 and b is zero, or (II) B is $[(CFX)_dO(CFX)_e]_f$, in which case a and b are zero, d and e are integers of 1 to 30, and f is an integer of 1 to 20, or (III) B is

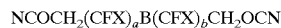

in which case a and b are 1, h is an integer of 1 to 10, and g and i are integers of 1 to 100, or(IV) B is

in which case a and b are integers of 1 to 10, j and k are integers whose ratio j/k is 1/1 to 10/1, m is an integer of 1 to 100, and ($CF_2CH_2$) and ($CF_2$-CFX) are randomly distributed units; and where X in all instances where it appears is fluorine or perfluoroalkyl of 1 to 10 carbon atoms.

35. A curable composition, comprising:
(a) an epoxy resin and curing agent therefor, wherein the epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; and
(d) a cyanate ester; wherein the cyanate ester has the formula

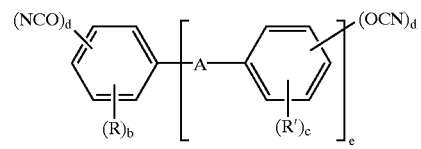

in which R represents hydrogen, halogen, linear or branched $C_1$–$C_9$-alkyl or phenyl, two adjacent radicals R on the same nucleus together forming a carbocyclic 5-membered or 6-membered ring or together and in conjunction with a hetero atom (O, S, N) forming a 5-membered or 6-membered heterocyclic ring, alkoxy radicals with 1 to 4 carbon atoms, alkoxy carbonyl radicals with 1 to 4 carbon atoms in the alkyl group;

R' has the same meaning as R or represents the group

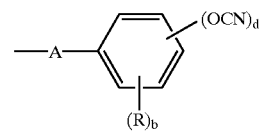

where A is direct bond, a $C_1$–$C_9$-alkylene group optionally substituted by $C_1$–$C_4$-alkyl or phenyl, a cycloaliphatic or aromatic 5-membered or 6-membered ring, or a cycloaliphatic or aromatic 5-membered or 6-membered ring; a is a number from 0 to 5 where e=1 and a number from 2 to 5 where e=0; b=5-a where e=1 and 6-(a+d) where c=0;

c=5-d; d is a number from 0 to 5; c is the number 0, 1, 2 or 3; with the proviso that the sum of a and d (a+d) always gives a number from 2 to 5.

36. A curable composition, comprising:
- (a) an epoxy resin and curing agent therefor, wherein said epoxy resin is a glycidyl ether resin or mixture of glycidyl ether resins containing, on average, greater than 2 epoxy groups per molecule;
- (b) 1,3,5-tris(2,4,6-tribromophenoxy)triazine and/or 2,2'-[(1-methylethylidene)bis[(2,6-dibromo-4,1-phenylene)oxy]]bis[4,6-bis[(2,4,6-tribromophenyl)oxy]-1,3,5-triazine];
- (c) a poly(phenylene ester) resin; and
- (d) a cyanate ester.

37. A curable composition, comprising:
- (a) an epoxidized cresol-formaldehyde novolac resin;
- (b) 1,3,5-tris(2,4,6-tribromophenoxy)triazine;
- (c) a poly(phenylene ether) resin having a number average molecular weight ranging from about 1,000 to 15,000 g/mol; and
- (d) a cyanate ester.

38. A cured composition comprising a cured residue of a curable composition comprising:
- (a) an epoxy resin and curing agent therefor, wherein said epoxy resin is essentially free of bromine atoms;
- (b) a flame retardant additive essentially free of phenolic groups and of epoxy groups, wherein said flame retardant is a condensation product of (i) a brominated phenol or a mixture of brominated phenols with (ii) a cyanuric halide;
- (c) a thermoplastic resin; and
- (d) a cyanate ester.

\* \* \* \* \*